(12) United States Patent
Dong et al.

(10) Patent No.: US 9,136,160 B2
(45) Date of Patent: Sep. 15, 2015

(54) SOLID HOLE ARRAY AND METHOD FOR FORMING THE SAME

(75) Inventors: Lijun Dong, Beijing (CN); Chao Zhao, Kessel-lo (BE)

(73) Assignee: INSTITUTE OF MICROELECTRONICS, CHINESE ACADEMY OF SCIENCES (CN)

( * ) Notice: Subject to any disclaimer, the term of this patent is extended or adjusted under 35 U.S.C. 154(b) by 0 days.

(21) Appl. No.: 13/697,372

(22) PCT Filed: Jul. 31, 2012

(86) PCT No.: PCT/CN2012/079388
§ 371 (c)(1),
(2), (4) Date: Nov. 11, 2012

(87) PCT Pub. No.: WO2014/000332
PCT Pub. Date: Jan. 3, 2014

(65) Prior Publication Data
US 2014/0001646 A1   Jan. 2, 2014

(30) Foreign Application Priority Data
Jun. 29, 2012 (CN) .......................... 2012 1 0226670

(51) Int. Cl.
*H01L 23/498*   (2006.01)
*H01L 21/768*   (2006.01)
(Continued)

(52) U.S. Cl.
CPC ........ *H01L 21/76802* (2013.01); *H01L 21/486* (2013.01); *H01L 23/147* (2013.01); *H01L 23/49827* (2013.01); *H01L 2924/0002* (2013.01)

(58) Field of Classification Search
CPC ................... H01L 21/76802; H01L 23/49827; H01L 23/147; H01L 21/486; H01L 2924/0002; H01L 2924/00; H01L 21/768; H01L 23/498
USPC .......................... 257/774, 668, 773, 758, 703
See application file for complete search history.

(56) References Cited

U.S. PATENT DOCUMENTS

| | | | |
|---|---|---|---|
| 5,393,351 A * | 2/1995 | Kinard et al. | 136/225 |
| 6,123,861 A * | 9/2000 | Santini et al. | 216/2 |
| 6,857,501 B1 * | 2/2005 | Han et al. | 181/158 |

(Continued)

FOREIGN PATENT DOCUMENTS

| | | |
|---|---|---|
| CN | 101665231 | 3/2010 |
| CN | 102328899 | 1/2012 |

(Continued)

OTHER PUBLICATIONS

International Search Report (Jul. 31, 2012) (in Chinese).
(Continued)

*Primary Examiner* — Alexander Oscar Williams
(74) *Attorney, Agent, or Firm* — Goodwin Procter LLP

(57) ABSTRACT

A solid hole array and a method for forming the same are disclosed. The solid hold array may comprise: substrate with a via; a top hole array base formed on a top surface of the substrate and a bottom hole array base formed on a bottom surface of the substrate, wherein a front hole is located in the top hole array base at a place corresponding to the via; and top protection layer formed on a surface and sidewalls of the top hole array base and a bottom protection layer formed on a surface of the bottom hole array base, wherein a rear window is located in the bottom hole array base and the bottom protection layer at a place corresponding to the via.

6 Claims, 4 Drawing Sheets

(51) Int. Cl.
*H01L 23/14* (2006.01)
*H01L 21/48* (2006.01)

(56) References Cited

U.S. PATENT DOCUMENTS

| | | | |
|---|---|---|---|
| 7,352,932 B1 * | 4/2008 | Chang et al. .................... 385/37 |
| 8,138,068 B2 | 3/2012 | Li et al. |
| 8,409,901 B2 * | 4/2013 | El-Gamal et al. ............... 438/51 |
| 2001/0019029 A1 * | 9/2001 | Tai et al. ....................... 210/506 |
| 2003/0080359 A1 * | 5/2003 | Hayakawa et al. ........... 257/256 |
| 2003/0137021 A1 * | 7/2003 | Wong et al. ................... 257/416 |
| 2004/0166140 A1 * | 8/2004 | Santini et al. ................. 424/424 |
| 2005/0167805 A1 * | 8/2005 | Usami ........................... 257/678 |
| 2006/0171888 A1 * | 8/2006 | Santini et al. .................. 424/9.1 |
| 2008/0047926 A1 * | 2/2008 | Santini et al. ..................... 216/2 |
| 2008/0122431 A1 * | 5/2008 | Berkcan et al. ............... 324/126 |
| 2008/0165226 A1 * | 7/2008 | Silverbrook .................... 347/54 |
| 2009/0097712 A1 * | 4/2009 | Harris ........................... 382/115 |
| 2009/0239377 A1 * | 9/2009 | Motoyama .................... 438/643 |
| 2010/0005877 A1 * | 1/2010 | Abe et al. .................. 73/204.26 |
| 2010/0006959 A1 * | 1/2010 | Kim et al. ..................... 257/415 |
| 2010/0327847 A1 * | 12/2010 | Leiber et al. ................. 324/71.1 |
| 2011/0053284 A1 | 3/2011 | Meller et al. |
| 2011/0175228 A1 * | 7/2011 | Lazovsky et al. ............. 257/768 |
| 2011/0305258 A1 * | 12/2011 | Boutchich et al. ............ 374/130 |
| 2011/0316169 A1 * | 12/2011 | Sunohara et al. ............. 257/774 |
| 2012/0007257 A1 * | 1/2012 | Nomura ........................ 257/774 |
| 2012/0021204 A1 | 1/2012 | Pei et al. |
| 2012/0040512 A1 | 2/2012 | Li et al. |
| 2012/0169320 A1 * | 7/2012 | Liang ........................... 324/71.1 |
| 2012/0182548 A1 * | 7/2012 | Harb et al. .................... 356/246 |
| 2013/0092541 A1 * | 4/2013 | Drndic et al. ................. 204/543 |
| 2013/0263946 A1 * | 10/2013 | Afzali-Ardakani et al. .. 137/561 R |
| 2013/0264219 A1 * | 10/2013 | Afzali-Ardakani et al. .. 205/703 |
| 2014/0106563 A1 * | 4/2014 | Lu et al. ....................... 438/653 |

FOREIGN PATENT DOCUMENTS

| | | |
|---|---|---|
| EP | 0841167 | 5/1998 |
| WO | WO 2004077503 A2 | 9/2002 |
| WO | 2008/031255 A2 * | 3/2008 |

OTHER PUBLICATIONS

Written Opinion (Jul. 31, 2012) (in Chinese).

* cited by examiner

SOLID HOLE ARRAY AND METHOD FOR FORMING THE SAME

CROSS-REFERENCE OF RELATED APPLICATIONS

The present application is a National Phase application of, and claims priority to, PCT Application No. PCT/CN2012/079388, filed on Jul. 31, 2012, entitled "SOLID HOLE ARRAY AND MANUFACTURE METHOD THEREOF," which claimed priority to Chinese Application No. CN 201210226670.6, filed on Jun. 29, 2012. Both the PCT Application and Chinese Application are incorporated herein by reference in their entireties.

FIELD OF THE INVENTION

The present invention relates to the field of semiconductor, and in particular to a solid hole array and a manufacture method thereof.

BACKGROUND OF THE INVENTION

In recent years, due to the application of some fields, such as biomolecular screening and gene sequencing, a micron hole array and a nano hole array have become an important device for molecular biology study. A solid nanometer hole array is produced by fine processing technique to generate the hole with controllability, integrateability and high effectiveness. During the process of the solid nano hole array, if a hole array is formed firstly and then a silicon substrate is etched, the hole array is easily to be crushed by hydrogen generated by an etching reaction when anisotropically etching the silicon substrate. Therefore, the present silicon-based solid nano hole array is manufactured by firstly etching the silicon substrate. Specifically, in general, the silicon substrate is firstly penetrated by wet etching or dry etching, and then a hole array is formed on a penetrated film (generally having a thickness of tens or hundreds of nanometers). However, since the film is too thin and easy to break, the feature of the film is hard to control, such that it is difficult to form the hole array on the penetrated film.

SUMMARY OF THE INVENTION

A brief summary of the present disclosure is given below to provide a basic understanding of some aspects of the present disclosure. It should be understand that this summary is not an exhaustive summary of the present disclosure. It is not intent to determine pivotal or important parts of the present disclosure, nor is it intent to limit the scope of the present disclosure. The purpose of the summary is merely to give some concepts briefly, as a preamble of a detailed description discussed later.

In order to solve the above problems, a main purpose of the present disclosure is to provide a method for manufacturing a solid hole array, comprises: forming a top hole array base and a bottom hole array base on a top surface and a bottom surface of a substrate respectively; forming a front hole in the top hole array base; forming a top protection layer on the substrate with the top hole array base, and forming a bottom protection layer on the bottom hole array base; forming a rear window in the bottom hole array base and the bottom protection layer; and etching through the substrate by alkali corrosion to connect the front hole with the rear window.

Optionally, the step of forming the front hole in the hole array base deposited on the top surface of the substrate further comprises: coating a photoresist on the top hole array base, and forming the front hole in the top hole array base by a photolithography and a reactive ion etching to expose the substrate.

Optionally, the step of forming the rear window in the protection layer deposited on the bottom surface of the substrate further comprises: coating a photoresist on the bottom protection layer, and forming the rear window in the bottom hole array base and the bottom protection layer by the photolithography and the reactive ion etching to expose the substrate.

Optionally, the thickness of the protection layer ranges from 8 nanometers to 20 nanometers.

Optionally, the material of the top hole array base and the bottom hole array base is low stress silicon nitride or low stress silicon oxide.

Optionally, the material of the top protection layer and the bottom protection layer is low temperature silicon nitride or low temperature silicon oxide.

Optionally, the alkali corrosion is performed using KOH or tetramethylammonium hydroxide.

Optionally, the width of the front hole is smaller than that of the rear window.

On the other hand, the present disclosure provides a solid hole array comprises: a substrate with a via; a top hole array base formed on a top surface of the substrate and a bottom hole array base formed on a bottom surface of the substrate, wherein a front hole is located in the top hole array base at a place corresponding to the via; and a top protection layer formed on a surface and sidewalls of the top hole array base and a bottom protection layer formed on a surface of the bottom hole array base, wherein a rear window is located in the bottom hole array base and the bottom protection layer at a place corresponding to the via.

According to the present disclosure, a solid hole array is manufactured by deposing the film twice to enhance the intensity of the front film, and thus it is not easily to be crushed by hydrogen generated during anisotropically etching the silicon substrate, and the problem of front protection can be solved. In addition, since the hole array is formed firstly and then the silicon is etched, the process steps are simplified, the cost is decreased, and the process is more suitable for a large scale manufacture.

DETAILED DESCRIPTION OF THE INVENTION

Figure 1:
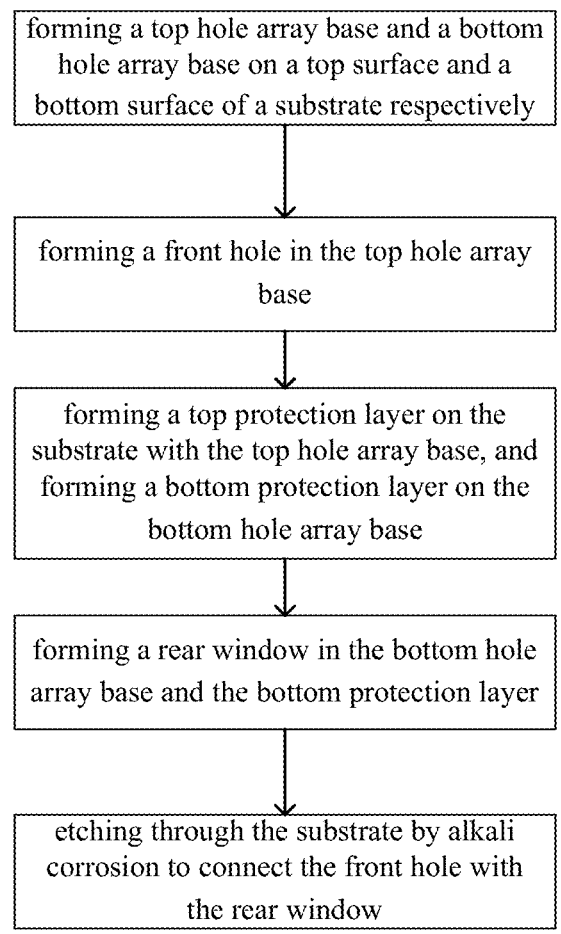
FIG. 1 is a flow chart of a method for manufacturing a solid hole array according to the present disclosure.

Embodiments of the present disclosure are illustrated below in conjunction with drawings. Elements and features described in one drawing or embodiment may be combined with elements and features in one or more other drawings or embodiments of the present disclosure. It should be noted that for purpose of clarity, presentations and descriptions of parts or processes which are unrelated with the present disclosure and known by those skilled in the art are omitted in the drawings and the description.

FIG. 1 illustrates a flow chart of a method for manufacturing a solid hole array of the present disclosure, and the specific steps thereof are as follow:

step 101, forming a top hole array base and a bottom hole array base on a top surface and a bottom surface of a substrate, respectively;

step 102, forming a front hole in the top hole array base 111;

step 103, forming a top protection layer 121 on the substrate 100 with the top hole array base 111, and forming a bottom protection layer 122 on the bottom hole array base 112;

step 104, forming a rear window in the bottom hole array base 112 and the bottom protection layer 122; and step 105, etching through the substrate 100 by alkali corrosion to connect the front hole with the rear window.

Based on the method for manufacturing the solid hole array illustrated in FIG. 1, the specific process flow of the method for manufacturing the solid hole array of the present disclosure is described in detail in conjunction with specific embodiments below.

Figure 2:
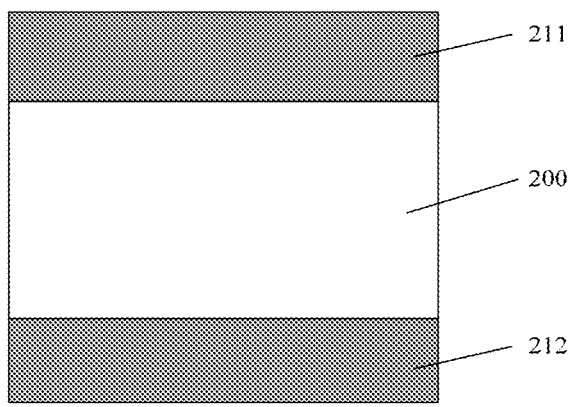
FIGS. 2-6 are specific process flow charts of a method for manufacturing a solid hole array according to an embodiment of the present disclosure.

FIGS. 2-6 illustrate the specific process flow charts of the method for manufacturing the solid hole array according to an embodiment of the present disclosure. The substrate in FIG. 2 is a silicon substrate, and the specific process steps are as follow.

As show in FIG. 2, hole array bases 211 and 212 is formed on the top surface and bottom surface of the silicon substrate 200, respectively, i.e., a top hole array base 211 is formed on the top surface of the silicon substrate 200 and a bottom hole array base 212 is formed on the bottom surface of the silicon substrate 200. In a preferable embodiment, the top hole array base 211 and the bottom hole array base 212 may be formed on the top surface and the bottom surface of the silicon substrate 200 in a manner of deposition.

In this step, the material of the hole array bases 211 and 212 may be low stress silicon nitride or low stress silicon oxide.

Figure 3:
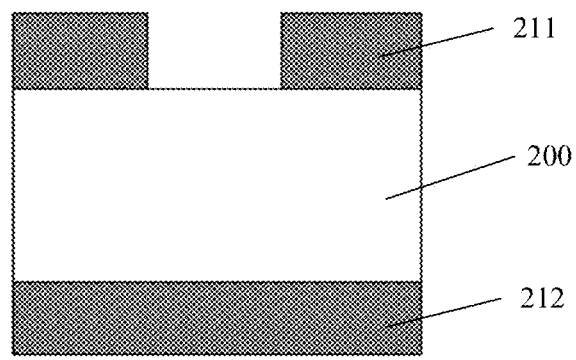

As shown in FIG. 3, a photoresist is coated on the top hole array base 211, and the front hole is formed in the top hole array base 211 by the photolithography and the reactive ion etching to expose the silicon substrate 200. In a preferable embodiment, the width of the front hole is in a range from tens of nanometers to several microns.

Figure 4:
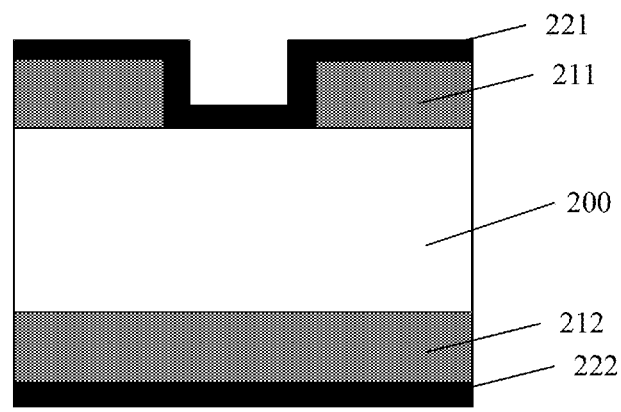

As shown in FIG. 4, the top protection layer 221 is formed on the silicon substrate 200 with the top hole array base 211 to cover the surface of the top hole array base 211, sidewalls of the front hole and the exposed portion of the silicon substrate 200. In addition, the bottom protection layer 222 is formed on the bottom hole array base 212.

In a preferable embodiment, the thickness of the protection layer 222 ranges from 8 nanometers to 20 nanometers, which is proportional to the thickness of the silicon substrate. In addition, the material of the protection layers 221 and 222 may be low temperature silicon nitride or low temperature silicon oxide. The low temperature silicon nitride or the low temperature silicon oxide has a high stress. Comprising with the silicon substrate material, the low temperature silicon nitride or the low temperature silicon oxide has a slower reaction rate during the alkali corrosion. In a subsequent process of silicon substrate corrosion, the protection layer can protect the covered hole array base from the damage caused by the alkali corrosion solution.

Figure 5:
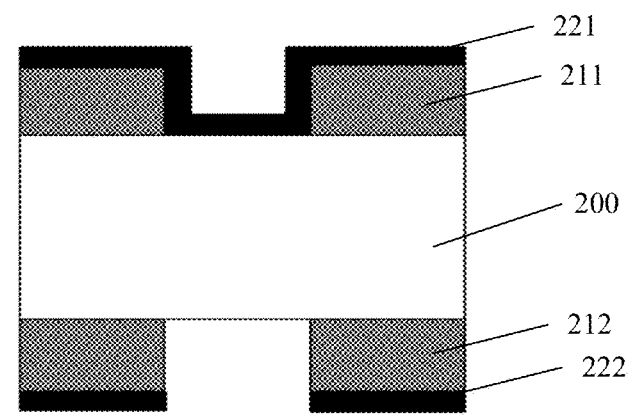

As shown in FIG. 5, a photoresist is coated on the bottom protection layer 222, and the rear window is formed in the bottom protection layer 222 and the bottom hole array base 212 by the photolithography and the reactive ion etching to expose the silicon substrate 200. The shape of the rear window may be a quadrate slot. The width of the rear window may be several millimeters.

Figure 6:
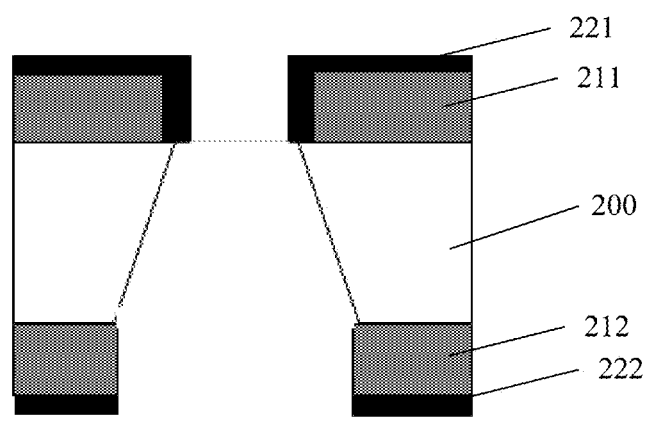

As shown in FIG. 6, the silicon substrate 200 is etched through by the alkali corrosion to connect the front hole with the rear window, so as to form a solid hole array. In a preferable embodiment, the alkali corrosion may be performed using an alkali corrosion solution such as KOH or tetramethylammonium hydroxide.

Since the top surface and sidewalls of the front hole are covered by the protection layer with the high stress, the intensity of the surrounding structure of the hole is enhanced, and thus it is hard to be crushed by hydrogen generated in the process of corrupting the silicon substrate. In addition, as described above, the width of the front hole ranges from tens of nanometers to several microns, and the width of the rear widow may be several millimeters. It can be seen that the width of the rear widow is much wider than that of the front hole. By this arrangement, hydrogen generated when etching the silicon substrate 200 can be easily discharged from the rear window.

In addition, since the reaction rate of the material of the protection layers 221 and 222 is much slower than that of the material of the silicon substrate when etching the silicon substrate 200, the alkali corrosion solution reacts on both sides of the protection layer 221 deposited on the top of the silicon substrate after the silicon substrate 200 is etched through, so as to etch this portion of the protection layer rapidly. In this way, the hole array base around the hole is protected when the solid hole array is formed, so as to implement a better control of the feature of the hole in the hole array.

The solid hole array of the present disclosure is formed based on the above process, specifically shown in FIG. 6. The solid hole array includes the substrate 200 with a via; the top hole array base 211 formed on the top surface of the substrate 200 and the bottom hole array base 212 formed on the bottom surface of the substrate 200, in which the front hole is located in the top hole array base 211 at a place corresponding to the via; and the top protection lay 221 formed on the surface and sidewalls of the top hole array base 211 and the bottom protection layer 222 formed on the surface of the bottom hole array base 212, in which the rear window is located in the bottom hole array base 212 and the bottom protection layer 222 at a place corresponding to the via.

Further, the material of the top hole array base and the bottom hole array base is low stress silicon nitride or low stress silicon oxide. The material of the top protection layer and the bottom protection layer is low temperature silicon nitride or low temperature silicon oxide.

Preferably, the thickness of the protection layer may ranges from 8 to 20 nanometers. The width of the front hole is smaller than that of the rear window.

The present disclosure and the advantage thereof are described; however, it should be understand that various amendments, substitutions, and changes may be made without departing from the spirit and scope of the present disclosure defined by the appended claims. Moreover, the scope of the present disclosure is not limited to the specific embodiments of the processes, devices, means, methods and steps described in the description. It will be easy to understand from contents of the present disclosure by those skilled in the art that processes, devices, means, methods or steps to be developed now or further which perform functions substantially the same as the corresponding embodiments or obtain results substantially the same as the corresponding embodiments may be used according to the present disclosure. Therefore, the appended claims are intent to comprise such processes, devices, means, methods or steps within their scopes.

What is claimed is:

1. A solid hole array, comprising:
a substrate with a via;
a top hole array base formed on a top surface of the substrate and a bottom hole array base formed on a bottom surface of the substrate, wherein a front hole is located in the top hole array base at a place corresponding to the via; and
a top protection layer formed on a surface and sidewalls of the top hole array base and a bottom protection layer formed on a surface of the bottom hole array base, wherein a rear window is located in the bottom hole array base and the bottom protection layer at a place corresponding to the via,
wherein a sidewall of the front hole is covered by the top protection layer, a sidewall of the rear window is made of a first material same as that of the bottom hole array base, and a sidewall of the via is made of a second material same as that of the substrate, wherein the first material is different from the second material, and the top protection layer is made of high stress material,
wherein the front hole is in communication with the rear window through the via in the substrate.

2. The solid hole array according to claim 1, wherein the material of the top hole array base and the bottom hole array base is low stress silicon nitride or low stress silicon oxide.

3. The solid hole array according to claim 1, wherein the material of the top protection layer and the bottom protection layer is low temperature silicon nitride or low temperature silicon oxide.

4. The solid hole array according to claim 1, wherein the thickness of the protection layer ranges from 8 nanometers to 20 nanometers.

5. The solid hole array according to claim 1, wherein the width of the front hole is smaller than that of the rear window.

6. The solid hole array according to claim 1, wherein the top hole array base and the bottom hole array base are made of low stress material.

* * * * *